United States Patent
Safa et al.

(10) Patent No.: US 11,469,675 B1
(45) Date of Patent: Oct. 11, 2022

(54) SWITCHED-MODE, HIGH BANDWIDTH, HIGH IMPEDANCE POWER SUPPLY

(71) Applicant: Keysight Technologies, Inc., Santa Rosa, CA (US)

(72) Inventors: Peyman Safa, Randolph, NJ (US); Marko Vulovic, Columbia, NJ (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/246,619

(22) Filed: May 1, 2021

(51) Int. Cl.
| | |
|---|---|
| *H02M 3/158* | (2006.01) |
| *H02M 1/00* | (2006.01) |
| *H02M 3/00* | (2006.01) |
| *H03K 5/24* | (2006.01) |
| *G01R 19/165* | (2006.01) |

(52) U.S. Cl.
CPC .... *H02M 3/1584* (2013.01); *G01R 19/16538* (2013.01); *H02M 1/007* (2021.05); *H02M 1/0009* (2021.05); *H02M 3/003* (2021.05); *H03K 5/24* (2013.01)

(58) Field of Classification Search
None
See application file for complete search history.

(56) References Cited

U.S. PATENT DOCUMENTS

| | | | |
|---|---|---|---|
| 6,370,047 B1 * | 4/2002 | Mallory | H02M 7/493 363/71 |
| 7,009,859 B2 | 3/2006 | Chen et al. | |
| 10,020,747 B2 * | 7/2018 | Madsen | H02M 1/44 |

(Continued)

OTHER PUBLICATIONS

Jun Honda, et al. "Application Note AN-1071, Class D Audio Amplifier Basics", International IOR Rectifier, available on the Internet at: https://www.infineon.com/dgdl/an-1071.pdf?fileld=5546d462533600a40153559538eb0ff1. Feb. 8, 2005.

(Continued)

*Primary Examiner* — Jeffrey A Gblende

(57) ABSTRACT

A switching converter has a first converter output for connection to a user load and a second converter output for connection to the user load. A first direct current rail power negative terminal has a first positive output and a first negative output connected to the second converter output. A second direct current rail power negative terminal has a second negative output and a second positive output connected to the first positive output. A first switch has a first positive terminal connected to the first positive output, a first negative terminal and a first control terminal. A second switch has a second positive terminal connected to the first negative terminal, a second negative terminal connected to the second negative output, and a second control terminal. A pulse width modulator has a first modulator output connected to the first control terminal, and a second modulator output connected to the second control terminal. An inductance is connected between the first converter output and the first negative terminal. A comparator controls the first pulse width modulator based on a voltage difference between a current measurement voltage that varies based on current through the inductance and a first set point voltage.

20 Claims, 5 Drawing Sheets

(56) References Cited

U.S. PATENT DOCUMENTS

2010/0296319 A1* 11/2010 Liu ................. H02M 3/285
363/21.12

OTHER PUBLICATIONS

Robert Sheehan, "Understanding and Applying Current-Mode Control Theory"; Texas Instruments, Literature No. SNVA555; Texas Instruments, available on the Internet at https://www.ti.com/lit/an/snva555/snva555.pdf, 2011.
Taufik Taufik, et al, "A New Multiphase Multi-Interleaving Buck Converter with Bypass LC", IEEE 978-1-4244-5226-2/10, 2010.
Cheng-Yu Tang, "Bidirectional Power Flow Control of a Multi Input Converter for Energy Storage System", Energies 2019, 12, 3756; dot10.3390/en12193756, 2019.
NPTEL-Ellectrical Engineering—Introduction to Hybrid and Electric Vehicles, Module 4: DC-DC Converters (https://hptel.ac.in/courses/108/103/108103009/),2013.
K. M. Nisar, "Implementation of Closed Loop Controller in a Dual Input DC-DC Converter for DC-Microgrid Application", IEEE 978-1-5090-3646-2/16, 2016.

* cited by examiner

SWITCHED-MODE, HIGH BANDWIDTH, HIGH IMPEDANCE POWER SUPPLY

BACKGROUND

Power instruments can be used to emulate power sources and sinks with high response speed, such as used for solar array simulators or electronic loads. To achieve very high output impedance and fast transient response, an output stage consisting of linear devices is traditionally used. Such designs use current source cells typically consisting of a transistor (MOSFET or BJT), current feedback and an operational amplifier circuit used to regulate the transistor's current. The transistor is arranged in series with an internal static rail and the customer's load. With this arrangement, typically referred to as a "gm cell", the transistor is subjected to the voltage differential between the static input rail voltage and customer's output voltage and carries the full load current, resulting in large power dissipation. At one extreme, if a customer is using the power instrument at very low output voltage and high output current, it may dissipate more than its rated output power internally, in the transistor. The ability to handle this large power dissipation requires aggressive thermal management which comes at the expense of solution density, solution cost, heating of surrounding air and increased acoustic noise. A circuit that uses this approach is shown in FIG. 1.

DETAILED DESCRIPTION

Figure 1:
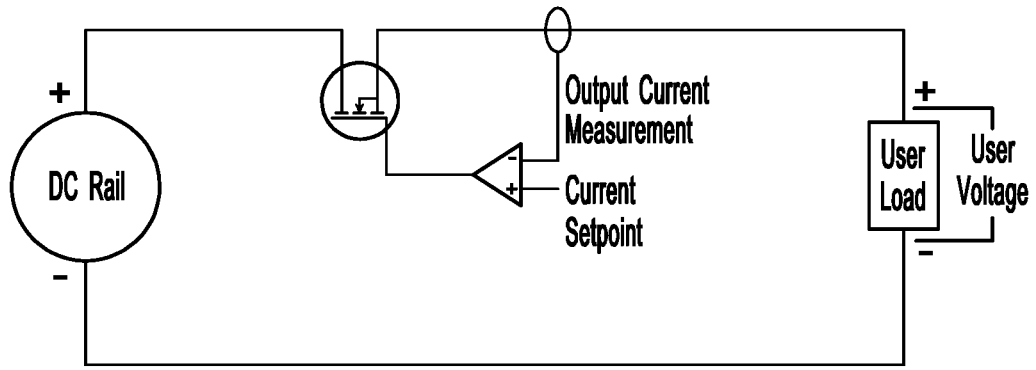
FIG. 1 shows a circuit diagram of a prior art power instrument.
Figure 2:
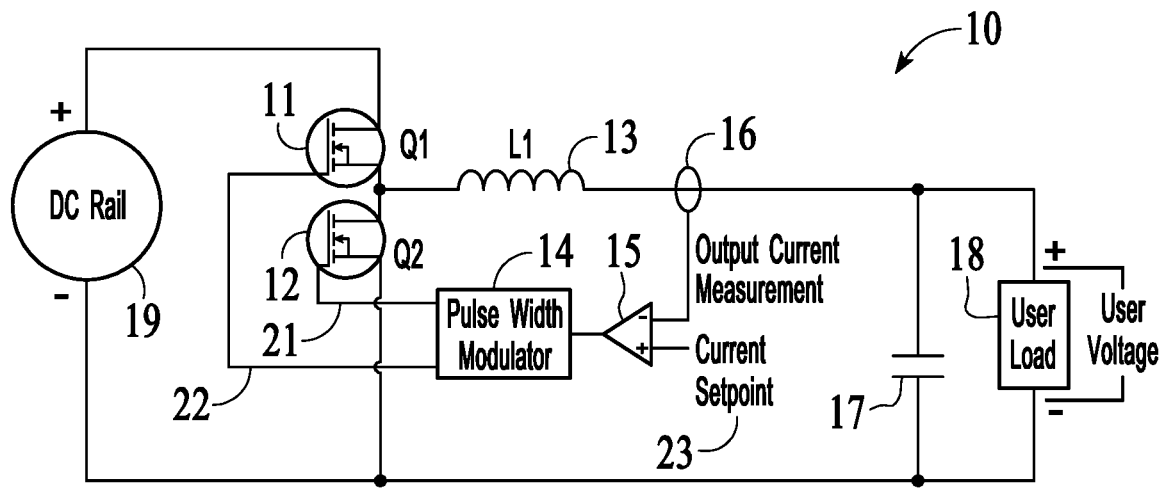
FIG. 2 shows a circuit diagram of a switching converter.

FIG. 2 shows a circuit diagram of a switching converter 10. Switching converters regulate power flow by rapidly switching their transistors between on (shorted) and off (open) states. In each of those states, the dissipated power in the converter is ideally zero and in practice, small. The efficiency of switching converters is limited by non-idealities in switches.

Switching converter 10 is shown to include a switch 11 and a switch 12. Switch 11 and switch 12 are high-speed switching devices that switch at a very high frequency while achieving high efficiency. A high switching frequency allows for a higher control bandwidth as well as physically smaller output filter components and the high efficiency reduces the size of the thermal management components (fans and heatsinks). For example, the use of Gallium-nitride (GaN) transistors to implement switch 11 and switch 12 make it possible to operate at switching frequencies higher than 1Mhz. The high switching frequency enables wider control bandwidth via the associated increase in the sample rate of a pulse width modulator (PWM) 14 and the reduction in by reducing the implicit delay that is proportional to the switching period.

For example, in FIG. 2, switch 11 and switch 12 are represented as Gallium Nitride (GaN) power transistors with a source of switch 11 connected to a drain of switch 12, a DC rail power source 19 connected between the drain of switch 11 and a source of switch 12. The gates of switch 11 and switch 12 are controlled by a pulse width modulator 14 so that when switch 11 is turned on, switch 12 is turned off and when switch 12 is turned on switch 11 is turned off.

Pulse width modulator (PWM) 14 is controlled by a comparator 15 that compares a current set point 23 with an inductor current measurement made at location 16 of the current flowing through filter inductance 13. When the inductor current measurement falls below the current setpoint 23, comparator 15 signals pulse width modulator 14 to vary the pulse width on a PWM output 21 and a PWM output 22 increase the amount of time switch 11 is turned on relative to the amount of time switch 12 is turned on. When the inductor current measurement is above the current setpoint 23, comparator 15 signals pulse width modulator 14 to vary the pulse width on PWM output 21 and PWM output 22 to increase the amount of time switch 12 is turned on relative to the amount of time switch 11 is turned on.

A filter circuit consisting of an inductance 13 and a capacitance 17 provide a first order filtering to smooth the signals from switch 11 and switch 12 to present an approximate DC signal to user load 18.

Figure 3:
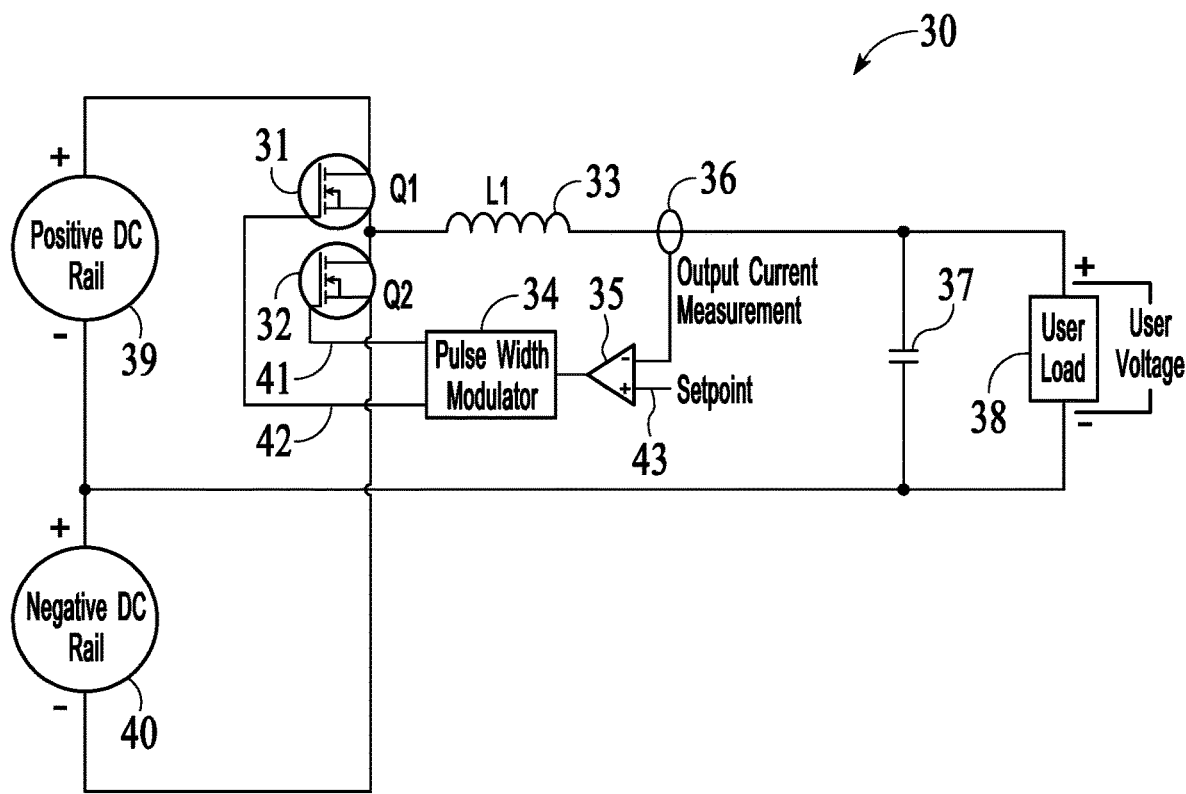
FIG. 3 shows a circuit diagram of a switching converter that includes both a positive DC rail and a negative DC rail.

In order to increase responsiveness at zero volts. A negative DC rail power source may be added. For example, FIG. 3 shows a switching converter 30 that includes a switch 31 and a switch 32. A positive DC rail 39 is connected in series with a negative DC rail 40, as shown. For example, switch 31 and switch 32 are represented as Gallium Nitride (GaN) power transistors with a source of switch 31 connected to a drain of switch 32, a drain of switch 31 connected to positive DC rail 39 and a source of switch 32 connected to negative DC rail 40, as shown. The gates of switch 31 and switch 32 are controlled by a pulse width modulator 34 so that when switch 31 is turned on, switch 32 is turned off and when switch 32 is turned on switch 31 is turned off.

Pulse width modulator 34 is controlled by a comparator 35 that compares a current set point 43 with an inductor current measurement made at location 36 of the current flowing through filter inductance 33. When the inductor current measurement falls below the current setpoint 43, comparator 35 signals pulse width modulator 34 to vary the pulse width on a PWM output 41 and a PWM output 42 increase the amount of time switch 31 is turned on relative to the amount of time switch 32 is turned on. When the inductor current measurement is above the current setpoint 43, comparator 35 signals pulse width modulator 34 to vary the pulse width on PWM output 41 and PWM output 42 to increase the amount of time switch 32 is turned on relative to the amount of time switch 31 is turned on.

A filter circuit consisting of an inductance 33 and a capacitance 37 provide first order filtering to smooth the signals from switch 31 and switch 32 to present an approximate DC signal to a user load 38. User load 38 and capacitance 37 are connected in parallel between location 36 and the node where positive rail 39 and negative DC rail 40 are joined, as shown in FIG. 3. Switch 31 and switch 32 are high-speed switching devices that switch at a very high frequency while achieving high efficiency.

In one application, switching converter 30 can be used to emulate the behavior of a solar panel when interfacing with a shunt-switching regulator. For example, switching converter 30 is used to emulate the output characteristic of a solar panel (a current source with high output impedance) while the shunt switching regulator repeatedly alternates between shorting the output terminals of the solution and clamping the output to a large DC rail. This requires the converter to be very responsive at OV. Traditional buck converters have trouble in this area because they cannot output negative voltages and run out of compliance at 0V, saturating the modulator at 0% duty cycle (Q2 it constantly on). During this process the output current loop can saturate since it is no longer able to achieve the desired setpoint, leading to delayed response and current overshoots. The asymmetric rail setup used by switching converter 30 allows modulation of the average inductor voltage smoothly to the necessary negative levels in order to achieve homogeneous loop response across the complete operating region. The ability to generate a small amount of negative voltage allows switching converter 30 to reduce the excessive current flowing though inductance 33 during high speed shunt switching operation. The net voltage present across switch 31 and switch 32 determines the ripple current in inductance 33 as well as the switching losses in switch 31 and switch 32. Therefore, negative rail voltage of negative DC rail 40 is chosen to be only as large as needed to provide the required negative voltage capability but not full bi-polar output voltage operation. Negative DC rail 40 is configured to sink and source current to maintain constant voltage.

Figure 4:
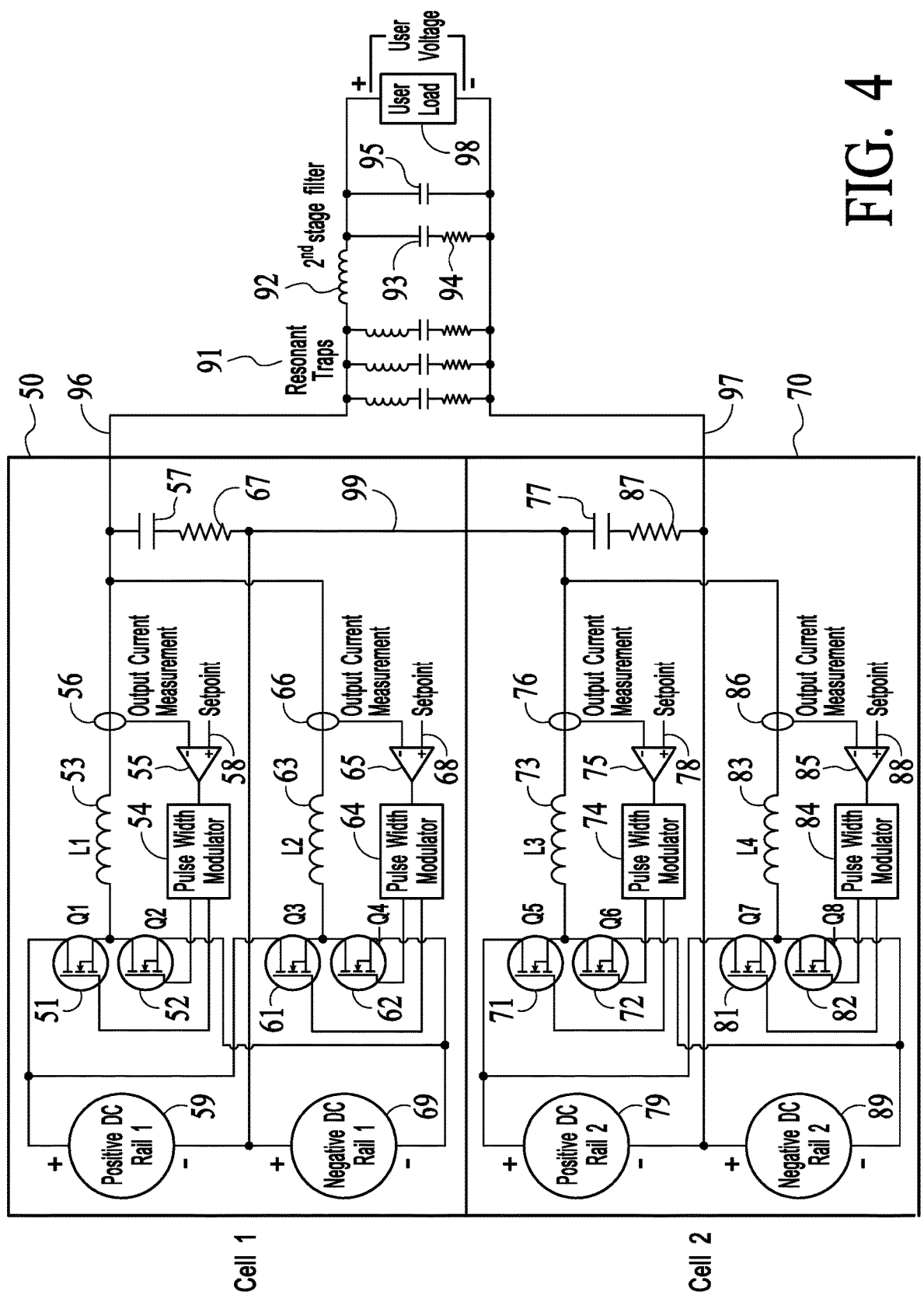
FIG. 4 shows a circuit diagram of a switching converter with a multi-phase switching converter topology.

FIG. 4 shows a switching converter that uses four identical power stages with the relative phase of their switching cycles offset by one-fourth cycle. The four power stages are arranged into two cells connected in series. A first cell 50 includes a first power stage and a second power stage arranged in parallel. A second cell 70 includes a third power stage and a fourth power stage arranged in parallel. This arrangement lowers the switching voltage for each power stage by a factor of 2, in turn reducing the capacitive switching losses that dominate dissipation at a selected switching frequency.

The first power stage includes a switch 51 and a switch 52. A positive DC rail 59 is connected in series with a negative DC rail 69, as shown. For example, switch 51 and switch 52 are represented as Gallium Nitride (GaN) power transistors with a source of switch 51 connected to a drain of switch 52, a drain of switch 51 connected to positive DC rail 59 and a source of switch 52 connected to negative DC rail 69, as shown. The gates of switch 51 and switch 52 are controlled by a pulse width modulator 54 so that when switch 51 is turned on, switch 52 is turned off and when switch 52 is turned on switch 51 is turned off.

Pulse width modulator 54 is controlled by a comparator 55 that compares a current set point 58 with an inductor current measurement made at a location 56. The inductor current measurement is a current measurement voltage that varies based on current at a location 56. When the inductor current measurement falls below the current setpoint 58, comparator 55 signals pulse width modulator 54 to vary the pulse width to increase the amount of time switch 51 is turned on relative to the amount of time switch 52 is turned on. When the inductor current measurement is above the current setpoint 58, comparator 55 signals pulse width modulator 54 to vary the pulse width to increase the amount of time switch 52 is turned on relative to the amount of time switch 51 is turned on.

The second power stage includes a switch 61 and a switch 62. For example, switch 61 and switch 62 are represented as Gallium Nitride (GaN) power transistors with a source of switch 61 connected to a drain of switch 62, a drain of switch 61 connected to positive DC rail 59 and a source of switch 62 connected to negative DC rail 69, as shown. The gates of switch 61 and switch 62 are controlled by a pulse width modulator 64 so that when switch 61 is turned on, switch 62 is turned off and when switch 62 is turned on switch 61 is turned off.

Pulse width modulator 64 is controlled by a comparator 65 that compares a current set point 68 with an inductor current measurement made at a location 66. When the inductor current measurement falls below the current setpoint 68, comparator 65 signals pulse width modulator 64 to vary the pulse width to increase the amount of time switch 61 is turned on relative to the amount of time switch 62 is turned on. When the inductor current measurement is above the current setpoint 68, comparator 65 signals pulse width modulator 64 to vary the pulse width to increase the amount of time switch 62 is turned on relative to the amount of time switch 61 is turned on.

The third power stage includes a switch 71 and a switch 72. A positive DC rail 79 is connected in series with a negative DC rail 89, as shown. For example, switch 71 and switch 72 are represented as Gallium Nitride (GaN) power transistors with a source of switch 71 connected to a drain of switch 72, a drain of switch 71 connected to positive DC rail 79 and a source of switch 72 connected to negative DC rail 89, as shown. The gates of switch 71 and switch 72 are controlled by a pulse width modulator 74 so that when switch 71 is turned on, switch 72 is turned off and when switch 72 is turned on switch 71 is turned off.

Pulse width modulator 74 is controlled by a comparator 75 that compares a current set point 78 with an inductor current measurement made at a location 76. When the inductor current measurement falls below the current setpoint 78, comparator 75 signals pulse width modulator 74 to vary the pulse width to increase the amount of time switch 71 is turned on relative to the amount of time switch 72 is turned on. When the inductor current measurement is above the current setpoint 78, comparator 75 signals pulse width modulator 74 to vary the pulse width to increase the amount of time switch 72 is turned on relative to the amount of time switch 71 is turned on.

The fourth power stage includes a switch 81 and a switch 82. For example, switch 81 and switch 82 are represented as Gallium Nitride (GaN) power transistors with a source of switch 81 connected to a drain of switch 82, a drain of switch 81 connected to positive DC rail 79 and a source of switch 82 connected to negative DC rail 89, as shown. The gates of switch 81 and switch 82 are controlled by a pulse width modulator 84 so that when switch 81 is turned on, switch 82 is turned off and when switch 82 is turned on switch 81 is turned off.

Pulse width modulator 84 is controlled by a comparator 85 that compares a current set point 88 with an inductor current measurement made at a location 86. When the inductor current measurement falls below the current setpoint 88, comparator 85 signals pulse width modulator 84 to vary the pulse width to increase the amount of time switch 81 is turned on relative to the amount of time switch 82 is turned on. When the inductor current measurement is above the current setpoint 88, comparator 85 signals pulse width modulator 84 to vary the pulse width to increase the amount of time switch 82 is turned on relative to the amount of time switch 81 is turned on.

The first power stage and the second power stage maintain the voltage between a location 99 and location 96. The third power stage and the fourth power stage maintain the voltage between location 97 and location 99. Voltage at location 97 is the common voltage for the circuit. Location 99 has the same voltage as present where the negative output of positive DC rail 59 connects to the positive output of negative DC rail 69.

A first stage filtering used to smooth the current differential between location 96 and location 97 is composed of an inductance 53 connected to switch 51 and switch 52, an inductance 63 connected to switch 61 and switch 62, an inductance 73 connected to switch 71 and switch 72, an inductance 83 connected to switch 81 and switch 82, a filter capacitance 57, a resistance 67 a filter capacitance 77 and a resistance 87 connected as shown. In addition, resonant traps 91 are used to filter resonant signals. A second stage filter consisting of an inductance 92, a capacitance 93, a resistor 94 and a capacitance 95 provide additional filtering in order to present a filtered DC signal across a load 98.

Since most of the output noise generated from a switching system occurs at known frequencies, the series resonant networks can be designed to present a very low impedance that surgically notches-out the ripple at those frequencies, thereby reducing the ripple seen at the output. The use of resonant networks in this way allows achieving the same noise performance as the traditional lowpass filtering approach with less output capacitance. This provides the benefits of reduced physical size and higher output impedance. The second stage filter is used to filter out very high frequency spikes while also isolating the notches in output impedance due to the resonant filters.

Inductor current measurement at location 56, location 66, location 76 and location 86 is done in a way to minimize measurement delay. For example, a hybrid circuit approach is used to provide a wide-band, isolated current measurement signal which mirrors the current in the first stage inductor. The signal is created by combining a low bandwidth, DC-coupled signal with a high bandwidth AC-coupled signal. The low frequency signal is generated by using a shunt and isolated voltage amplifier. The high frequency signal is derived from a sense winding integrated into the first stage inductor that provides a high fidelity, isolated signal representing the AC voltage applied to the inductor. The two signals are fed into a summing amplifier which filters and blends them, yielding a combined signal with flat gain response across the frequency range of interest.

The combination of wide bandwidth, good accuracy, and isolation with excellent common-mode rejection is critical to achieving a high performance inner current loop. The pulse width modulator gain, as a function of first stage capacitor voltage, yields a cycle by cycle average current loop while maintaining full bandwidth. The flat gain of the current feedback creates a high output resistance which provides consistent gain across a wide range of customer load inductance, maximizing the performance of the outer current regulation loop.

Figure 5:
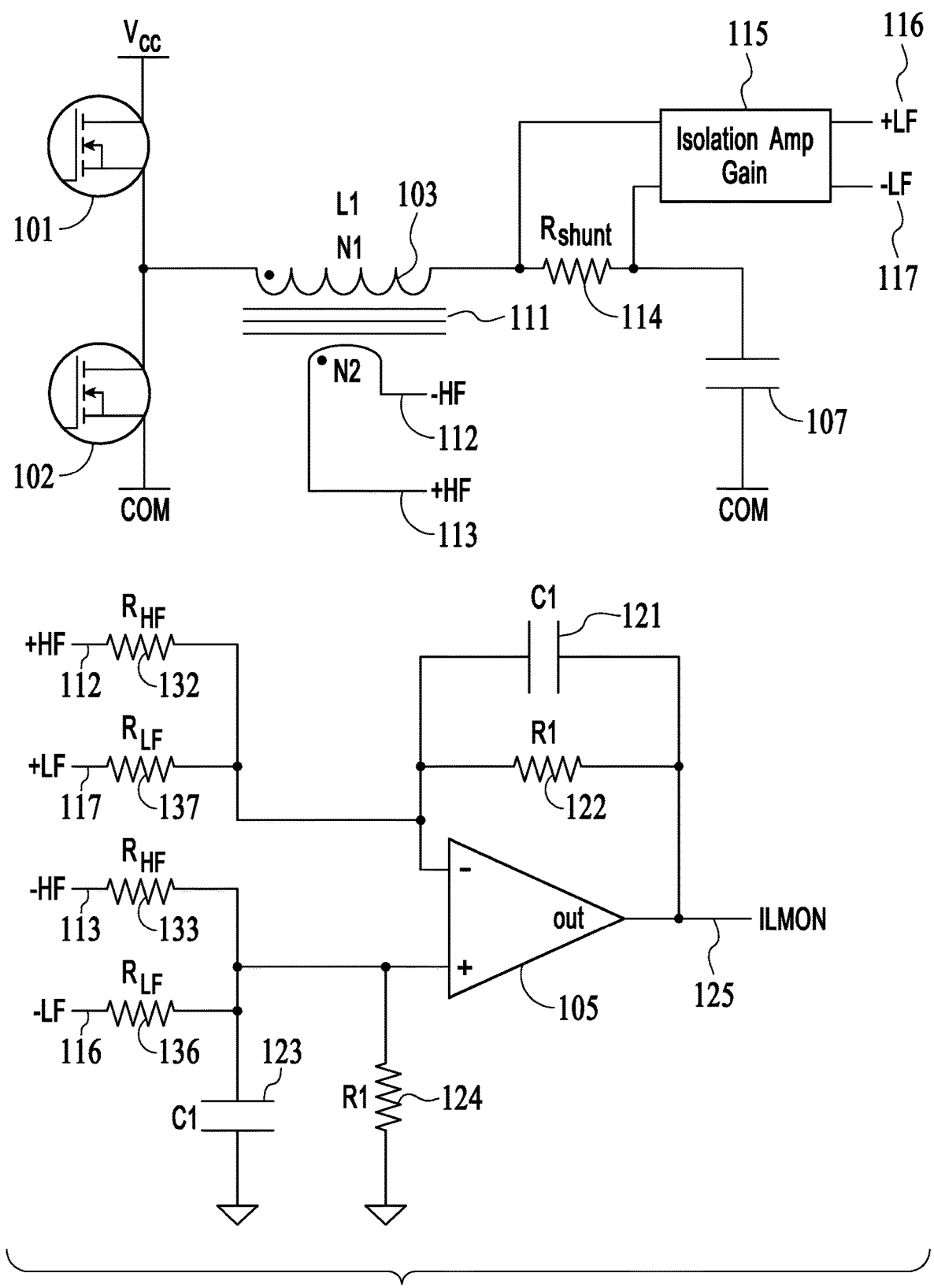
FIG. 5 shows a high-bandwidth hybrid current measurement system.

For example, FIG. 5 shows a hybrid circuit that functions as described above. In the hybrid circuit, a switch 101 is the equivalent of switch 31 shown in FIG. 3. Switch 102 is the equivalent of switch 32. An inductor 103 is the equivalent of inductor 33. A capacitance 107 is the equivalent of capacitor 37.

A filter inductor 11 with an integrated sense winding produces a -HF signal 112 and a +HF signal 113. An isolation amp gain circuit measures current across a shunt resistance 114 to produce a +LF signal 116 and a -LF signal 112.

To generate an inductor current measurement signal for a comparator such as comparator 35 in FIG. 3, an operational amplifier 105, a resistance 132, a resistance 137, a resistance 133, a resistance 136, a resistance 122, a resistance 124, a capacitance 121 and a capacitance 123, for example, are connected as shown in FIG. 5. An inductor current measurement signal 125 is used as an inductor current measurement signal for input to a comparator such as comparator 35 in FIG. 3.

For example, within each of pulse width modulator 54, pulse width modulator 64, pulse width modulator 74 and pulse width modulator 84, peak current mode control can be modified by adjusting the gain of the pulse width modulators as a function of first stage capacitor voltage, yielding a cycle by cycle average current loop while maintaining full bandwidth. The flat gain of the current feedback creates a high output resistance which provides consistent gain across a wide range of load inductance across the user load, maximizing the performance of the outer current regulation loop. This is illustrated in FIG. 6.

Figure 6:
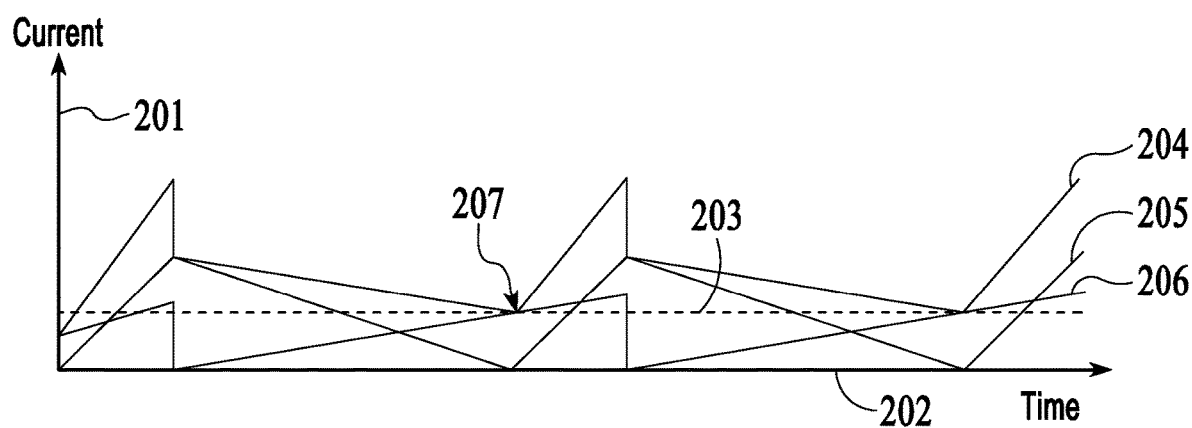
FIG. 6 illustrates cycle-by-cycle current signal correction.

FIG. 6 is a simplified diagram where an axis 201 represents current and an axis 202 represents time. An inductor slope cancellation ramp signal 206 is added to an inductor current signal 205 to produce an adjusted current feedback signal 204. The slope of inductor slope cancellation ramp signal 206 is a function of the first stage capacitor voltage (e.g., the voltage across capacitor 37 shown in FIG. 3) and is designed to have half the amount of slope present on the falling slope of inductor current signal 20 with an inverted polarity. By combining inductor slope cancelation ramp signal 206 with inductor current signal 205, one half of the peak to peak ripple in the signal is subtracted, resulting in the signal having a value 203 equal to the average value of the inductor current at the instant that the PWM comparator trips, at a location 207 shown in FIG. 6.

Using this technique, a current feedback signal is created which retains the full bandwidth of the inductor current while representing the average value of the inductor current regardless of operating point. Taken together, this high bandwidth and operating point-independence enable achieving the highest possible output impedance while maintaining loop stability.

While the switches in the Figures here are represented as Gallium Nitride (GaN) power transistors each having a source, drain and a gate, other types of technology may be used to implement switches. For example, alternative to MOSFETs such as GAN power transistors, bipolar junction (Bipolar) can be used or any other type of transistor or switch that has a control terminal, a positive terminal and a negative terminal. Examples of a control terminal of a switch include the base terminal of a NPN transistor, the base terminal of an PNP transistor, the gate terminal of n-channel MOSFET and the gate terminal of a p-channel MOSFET. Examples of a positive terminal of a switch include the collector terminal of a NPN transistor, the emitter terminal of an PNP transistor, the drain terminal of n-channel MOSFET and the source terminal of a p-channel MOSFET. Examples of a negative terminal of a switch include the emitter terminal of a NPN transistor, the collector terminal of an PNP transistor, the source terminal of n-channel MOSFET and the drain terminal of a p-channel MOSFET.

The foregoing discussion discloses and describes merely exemplary methods and embodiments. For example, FIG. 4 can be varied by eliminating cell 2 and connecting location 97 to location 99 to provide the common voltage of the circuit. Alternatively, the two cells can remain but the parallelism removed by removing in each cell the bottom two switches and their associated PWM, inductor and comparator.

As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A switching converter comprising:
   a first cell, including:
      a first cell output,
      a first direct current rail power negative terminal having:
         a first positive output, and
         a first negative output,
      a second direct current rail power negative terminal, having:
         a second negative output, and
         a second positive output connected to the first negative output,
      a first switch having:
         a first positive terminal connected to the first positive output,
         a first negative terminal, and
         a first control terminal,
      a second switch having:
         a second positive terminal connected to the first negative terminal,
         a second negative terminal connected to the second negative output, and
         a second control terminal,
      a first pulse width modulator having:
         a first modulator output connected to the first control terminal,
         a second modulator output connected to the second control terminal,
      a first inductance connected between the first cell output and the first negative terminal, and
      a first comparator that controls the first pulse width modulator based on a voltage difference between a current measurement voltage that varies based on current first inductance and a first set point voltage; and
   a second cell, including:
      a second cell output,
      a third direct current rail power negative terminal having:
         a third positive output, and
         a third negative output connected to the second cell output,
      a fourth second direct current rail power negative terminal, having:
         a fourth negative output, and
         a fourth positive output connected to the third negative output,
      a third switch having:
         a third positive terminal connected to the third positive output,
         a third negative terminal, and
         a third control terminal,
      a fourth switch having:
         a fourth positive terminal connected to the third negative terminal,
         a fourth negative terminal connected to the fourth negative output, and
         a fourth control terminal,
      a second pulse width modulator having:
         a third modulator output connected to the third control terminal,
         a fourth modulator output connected to the fourth control terminal,
      a second inductance connected between the first negative output and the third negative terminal, and
      a second comparator that controls the second pulse width modulator based on a voltage difference between a current measurement voltage that varies based on current through the second inductance and a second set point voltage.

2. A switching converter as in claim 1, wherein:
   the first cell additionally includes:
      a fifth switch having:
         a fifth positive terminal connected to the first positive output,
         a fifth negative terminal, and
         a fifth control terminal,
      a sixth switch having:
         a sixth positive terminal connected to the fifth negative terminal,
         a sixth negative terminal connected to the second negative output, and
         a sixth control terminal,
      a third pulse width modulator having:
         a fifth modulator output connected to the fifth control terminal, and
         a sixth modulator output connected to the sixth control terminal,
      a third inductance connected between the first cell output and the fifth negative terminal,
      a third comparator that controls the third pulse width modulator based on a voltage difference between the current measurement voltage that varies based on current through the third inductance and a third set point voltage;
   the second cell additionally includes:
      a seventh switch having:
         a seventh positive terminal connected to the third positive output,
         a seventh negative terminal, and
         a seventh control terminal,
      an eighth switch having:
         an eighth positive terminal connected to the seventh negative terminal,
         an eighth negative terminal connected to the fourth negative output, and
         an eighth control terminal,
      a fourth pulse width modulator having:
         a seventh modulator output connected to the seventh control terminal, and
         an eighth modulator output connected to the eighth control terminal,
      a fourth inductance connected between the first negative output and the seventh negative terminal, and
      a fourth comparator that controls the fourth pulse width modulator based on a voltage difference between the current measurement voltage that varies based on current through the fourth inductance and a fourth set point voltage.

3. A switching converter as in claim 2, wherein switching cycles of the first pulse width modulator, the second pulse width modulator, the third pulse width modulator and the fourth pulse width modulator are offset from each other by one fourth cycle.

4. A switching converter as in claim 2, additionally comprising:
a first capacitance and a first resistance connected in series between the first cell output and the first negative output of the first direct current rail power negative terminal; and
a second capacitance and a second resistance connected in series between the first negative output of the first direct current rail power negative terminal and the second cell output.

5. A switching converter as in claim 2, additionally comprising:
a resonant trap connected between the first cell output and the second cell output, the resonant trap comprising a fifth inductance, a first capacitance and a first resistance connected in series.

6. A switching converter as in claim 2, additionally comprising:
a plurality of resonant traps connected between the first cell output and the second cell output, each resonant trap in the plurality of resonant traps comprising a fifth inductance, a first capacitance and a first resistance connected in series.

7. A switching converter as in claim 2, additionally comprising:
resonance filter, including:
a fifth inductance connected between the first cell output and a first end of a user load, a second end of the user load being connected to the second cell output, and
a first capacitance connected between the first end of the user load and the second end of the user load.

8. A switching converter as in claim 7 wherein the resonance filter additionally includes:
a first resistance and a second capacitance connected in series between the first end of the user load and the second end of the user load.

9. A switching converter as in claim 2 wherein the first switch, the second switch, the third switch, the fourth switch, the fifth switch, the sixth switch, the seventh switch and the eighth switch are Gallium Nitride (GaN) transistors.

10. A switching converter as in claim 1, additionally comprising:
a first capacitance and a first resistance connected in series between the first cell output and the first negative output of the first direct current rail power negative terminal; and
a second capacitance and a second resistance connected in series between the second cell output and the first negative output of the first direct current rail power negative terminal.

11. A switching converter as in claim 1, additionally comprising:
a resonant trap connected between the first cell output and the second cell output, the resonant trap comprising a third inductance, a first capacitance and a first resistance connected in series.

12. A switching converter as in claim 1, additionally comprising:
a plurality of resonant traps connected between the first cell output and the second cell output, each resonant trap in the plurality of resonant traps comprising a third inductance, a first capacitance and a first resistance connected in series.

13. A switching converter as in claim 1, additionally comprising:
resonance filter, including:
a third inductance connected between the first cell output and a first end of a user load, a second end of the user load being connected to the second cell output, and
a first capacitance connected between the first end of the user load and the second end of the user load.

14. A switching converter as in claim 13 wherein the resonance filter additionally includes:
a first resistance and a second capacitance connected in series between the first end of the user load and the second end of the user load.

15. A switching converter as in claim 1 wherein the first switch, the second switch, the third switch and the fourth switch are Gallium Nitride (GaN) transistors.

16. A switching converter comprising:
a first switching converter stage having a first switching stage converter output and a second switching stage converter output; and
a second switching converter stage having a first switching stage converter output and a second switching stage converter output;
wherein the first switching stage converter output of the second switching converter stage is connected to the second switching stage converter output of the first switching converter stage;
wherein a user load is connected between the second switching stage converter output of the second switching converter stage and the first switching stage converter output of the first switching converter stage; and
wherein the first switching converter stage and the second switching converter stage each comprise:
a first direct current rail power negative terminal having:
a first positive output, and
a first negative output connected to the second switching stage switching stage converter output,
a second direct current rail power negative terminal, having:
a second negative output, and
a second positive output connected to the first positive output,
a first switch having:
a first positive terminal connected to the first positive output,
a first negative terminal, and
a first control terminal,
a second switch having:
a second positive terminal connected to the first negative terminal,
a second negative terminal connected to the second negative output, and
a second control terminal,
a first pulse width modulator having:
a first modulator output connected to the first control terminal, and
a second modulator output connected to the second control terminal,
an inductance connected between the first switching stage converter output and the first negative terminal, and
a comparator that controls the first pulse width modulator based on a voltage difference between a current measurement voltage that varies based on current through the inductance and a first set point voltage.

17. A switching converter as in claim 16, wherein the first switch and the second switch are Gallium Nitride (GaN) transistors.

18. A switching converter as in claim 16, additionally comprising:
   a third switching converter stage connected in parallel with the first switching converter; and
   a fourth switching converter stage connected in parallel with the second switching converter.

19. A switching converter as in claim 18, wherein switching cycles of pulse width modulators within the first switching converter stage, the second switching converter stage, the third switching converter stage and the fourth switching converter stage are offset from each other by one fourth cycle.

20. A switching converter comprising:
   a converter output;
   a first direct current rail power negative terminal having:
      a first positive output, and
      a first negative output;
   a second direct current rail power negative terminal, having:
      a second negative output, and
      a second positive output connected to the first negative output,
   a first switching stage, including:
      a first switch having:
         a first positive terminal connected to the first positive output,
         a first negative terminal, and
         a first control terminal,
      a second switch having:
         a second positive terminal connected to the first negative terminal,
         a second negative terminal connected to the second negative output, and
         a second control terminal,
      a first pulse width modulator having:
         a first modulator output connected to the first control terminal,
         a second modulator output connected to the second control terminal,
      a first inductance connected between the converter output and the first negative terminal, and
      a first comparator that controls the first pulse width modulator based on a voltage difference between a current measurement voltage that varies based on current first inductance and a first set point voltage; and
   a second switching stage, including:
      a third switch having:
         a third positive terminal connected to the first positive output,
         a third negative terminal, and
         a third control terminal,
      a fourth switch having:
         a fourth positive terminal connected to the third negative terminal,
         a fourth negative terminal connected to the fourth negative output, and
         a fourth control terminal,
      a second pulse width modulator having:
         a third modulator output connected to the third control terminal,
         a fourth modulator output connected to the fourth control terminal,
      a second inductance connected between the converter output and the third negative terminal, and
      a second comparator that controls the second pulse width modulator based on a voltage difference between a current measurement voltage that varies based on current through the second inductance and a second set point voltage.

\* \* \* \* \*